(12) United States Patent
Iriguchi et al.

(10) Patent No.: US 10,605,851 B2
(45) Date of Patent: *Mar. 31, 2020

(54) PRINTED WIRING BOARD, CRACK PREDICTION DEVICE, AND CRACK PREDICTION METHOD

(71) Applicant: FUJITSU LIMITED, Kawasaki-shi, Kanagawa (JP)

(72) Inventors: Shigeo Iriguchi, Kawasaki (JP); Naoki Nakamura, Hachioji (JP); Shigeru Sugino, Edogawa (JP); Takahide Mukoyama, Kamakura (JP); Ryo Kanai, Kawasaki (JP); Nobuo Taketomi, Kodaira (JP); Kiyoyuki Hatanaka, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 148 days.

This patent is subject to a terminal disclaimer.

(21) Appl. No.: 15/625,565

(22) Filed: Jun. 16, 2017

(65) Prior Publication Data
US 2017/0285096 A1    Oct. 5, 2017

Related U.S. Application Data

(62) Division of application No. 13/941,925, filed on Jul. 15, 2013, now Pat. No. 9,709,619.

(30) Foreign Application Priority Data

Sep. 19, 2012 (JP) ................................. 2012-205868

(51) Int. Cl.
*G01R 31/04* (2006.01)
*G01R 31/28* (2006.01)
*H05K 1/02* (2006.01)

(52) U.S. Cl.
CPC ....... *G01R 31/046* (2013.01); *G01R 31/2805* (2013.01); *H05K 1/0268* (2013.01);
(Continued)

(58) Field of Classification Search
None
See application file for complete search history.

(56) References Cited

U.S. PATENT DOCUMENTS 7,254,505 B2 * 8/2007 Owens ............. G01R 31/31725
327/158
8,878,076 B2 * 11/2014 Yoshimura ........... H05K 1/0353
174/256

(Continued)

FOREIGN PATENT DOCUMENTS

JP     63-274881 A     11/1988
JP     04-208597 A      7/1992
(Continued)

OTHER PUBLICATIONS

Japan Patent Office, Office Action for corresponding Japanese Patent Application No. 2012-205868, dated Mar. 15, 2016. (No copy provided, per MPEP 609. Copy submitted in parent U.S. Appl. No. 13/941,925).

(Continued)

*Primary Examiner* — Paresh Patel
(74) *Attorney, Agent, or Firm* — Fujitsu Patent Center

(57) ABSTRACT

A printed wiring board includes: a laminated body that has a plurality of wiring layers laminated therein; a first through hole that electrically connects two or more wiring layers with each other; and a second through hole that has strength to expansion and contraction of the laminated body less than in the first through hole.

1 Claim, 17 Drawing Sheets

(52) U.S. Cl.
CPC ......... *H05K 1/0271* (2013.01); *H05K 1/0298* (2013.01); *H05K 2203/163* (2013.01)

(56) References Cited

U.S. PATENT DOCUMENTS

| | | | |
|---|---|---|---|
| 9,709,619 B2* | 7/2017 | Iriguchi | G01R 31/2805 |
| 2005/0146336 A1 | 7/2005 | Kimura et al. | |
| 2007/0144775 A1* | 6/2007 | Hasegawa | H05K 3/421 |
| | | | 174/262 |
| 2009/0095509 A1* | 4/2009 | Hirano | H05K 1/115 |
| | | | 174/250 |
| 2010/0018758 A1* | 1/2010 | Yoshimura | H05K 3/4608 |
| | | | 174/256 |
| 2010/0094566 A1 | 4/2010 | Grant et al. | |

FOREIGN PATENT DOCUMENTS

| | | |
|---|---|---|
| JP | 8-242051 A | 9/1996 |
| JP | 11-204944 A | 7/1999 |
| JP | 2002-076187 A | 3/2002 |
| JP | 2007-318035 A | 12/2007 |
| JP | 2009-164358 A | 7/2009 |
| JP | 2011-25842 A | 12/2011 |

OTHER PUBLICATIONS

"Test Pattern of Printed Wiring Board" by Kiyota Sainichi Sep. 17, 1996 (English Translation). (No copy provided, per MPEP 609. Copy submitted in parent U.S. Appl. No. 13/941,925).

* cited by examiner

FIG. 7
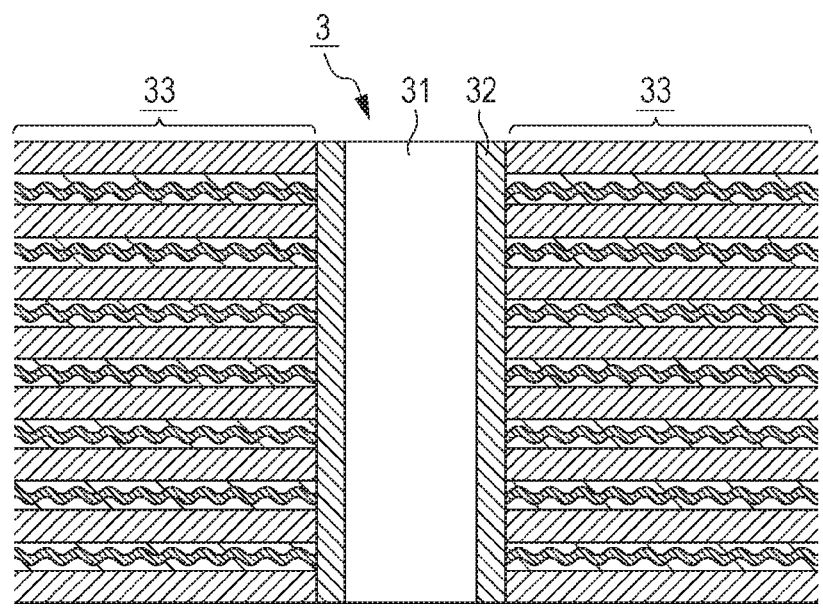
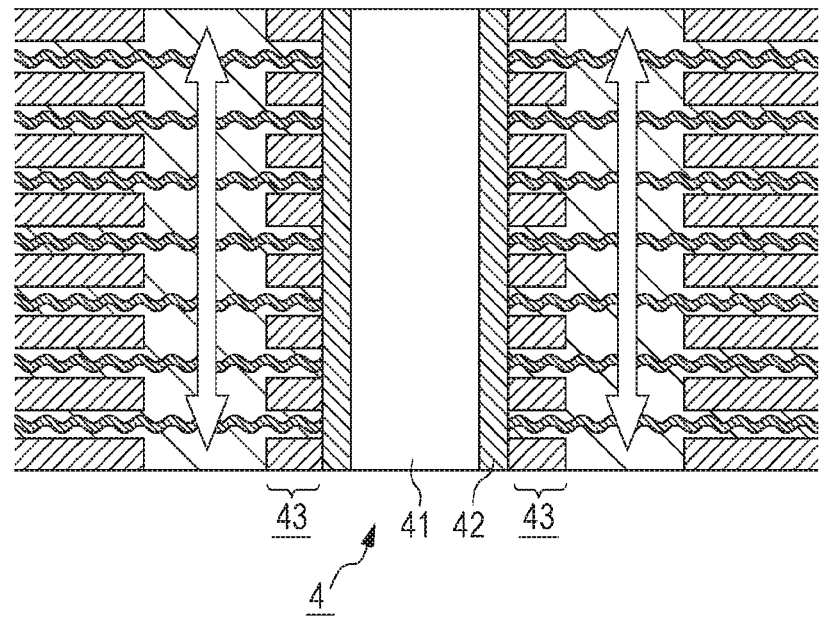

FIG. 13A
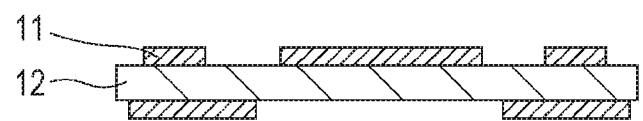
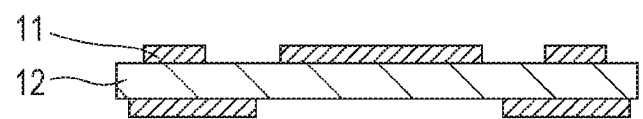
FIG. 13B
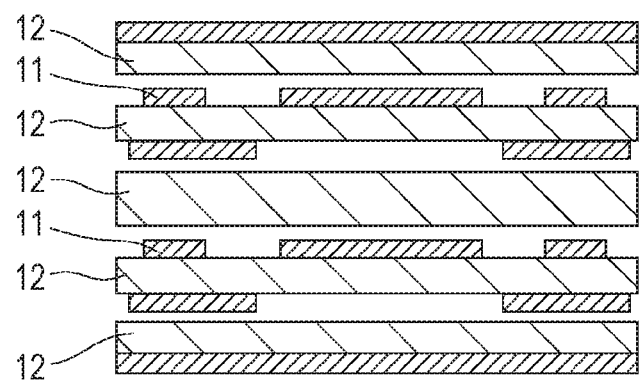

PRINTED WIRING BOARD, CRACK PREDICTION DEVICE, AND CRACK PREDICTION METHOD

CROSS-REFERENCE TO RELATED APPLICATION

This application is a Divisional Application of co-pending U.S. application Ser. No. 13/941,925, filed on Jul. 15, 2013, which claims priority to Japanese Patent Application No. 2012-205868, filed on Sep. 19, 2012, the entire content of all of the above applications are hereby incorporated by reference.

FIELD

The embodiments discussed herein are related to a printed wiring board, a crack prediction device, and a crack prediction method.

BACKGROUND

In recent years, with downsizing and advancing functionality of electronics, printed wiring boards provided in electronics have highly densified wiring. In addition, with advancing functionality of electronic components mounted on printed wiring boards, the temperature of heat applied to such a printed wiring board is also rises. For example, a printed wiring board provided in electronics having strict demands for security, such as electronics mounted in an automobile, also has a higher demanded upper temperature limit.

Printed wiring boards may include, for example, multi-layered printed wiring boards that is possible to be downsized and highly densified (for example, refer to Japanese Laid-open Patent Publication No. 04-208597).

A multilayered printed wiring board is equipped with a through hole electrically connecting wiring patterns of each layer with each other. Japanese Laid-open Patent Publication Nos. 2007-318035 and 2009-164358 are further examples of related art.

With the densification of wiring, through holes in printed wiring boards are also being downsized. Compared with larger through holes, smaller through holes are poor in strength of an electrically conductive material in the through holes (for example, copper plating).

In addition, with advancing performance of electronic components, operation temperature of printed wiring boards is also becoming higher. Such a printed wiring board expands and contracts in accordance with a change in an ambient temperature.

For example, an epoxy resin used for a printed wiring board has a greater coefficient of thermal expansion compared with an electrically conductive material formed in the through hole, so that thermal stress is applied to the electrically conductive material in the through hole when the printed wiring board expands and contracts.

As just described, through holes are in a situation that is prone to develop a crack associated with downsizing and a rise in temperature of a printed wiring board. It is difficult not to expand and contract a printed wiring board, which causes development of cracks, and intensification of structural strength of a through hole makes it difficult to downsize a printed wiring board.

Consequently, it is considered that avoidance of defects in electronics derived from a trouble in a printed wiring board is realistic action.

SUMMARY

According to an aspect of the invention, A printed wiring board includes: a laminated body that has a plurality of wiring layers laminated therein; a first through hole that electrically connects two or more wiring layers with each other; and a second through hole that has strength to expansion and contraction of the laminated body less than in the first through hole.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 is one example of a diagram of comparing lands around a through hole for circuit with lands around a through hole for prediction according to a sixth example;

FIGS. 13A through 13E are examples of drawings illustrating first through fifth states of the manufacturing procedure according to the first example;

DESCRIPTION OF EMBODIMENTS

Descriptions are given below to embodiments. The embodiments described below are merely illustrative and do not limit the present technical scope to the following modes.

<Embodiment of Printed Wiring Board>

Figure 1:
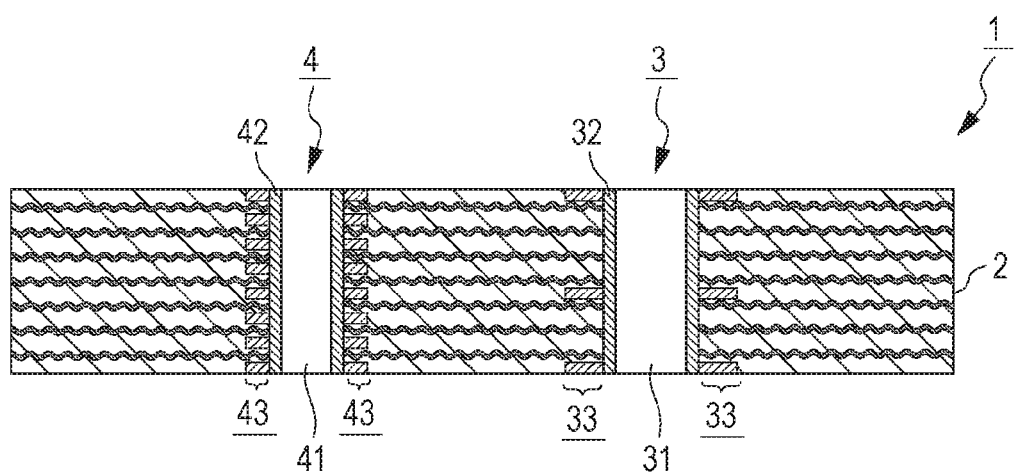
FIG. 1 is one example of a diagram illustrating a printed wiring board.

FIG. 1 is one example of a diagram illustrating a printed wiring board. A printed wiring board 1 is provided with a laminated body 2, a through hole 3 for circuit (one example of "a first through hole"), and a through hole 4 for prediction (one example of "a second through hole"). The laminated body 2 is a lamination of a plurality of wiring layers. The materials to constitute the laminated body 2 may be any, and a glass cloth cured with a resin, for example, suppresses expansion and contraction in a lamination direction repeated due to a change in temperature and humidity compared with those using papers. As the expansion and contraction of the laminated body 2 in a lamination direction is suppressed, a possibility of fatigue failure of the through holes formed in the laminated body 2 is reduced.

The through hole 3 for circuit electrically connects two or more wiring layers with each other by joining copper plating 32, which is an electrically conductive material formed on a wall of a through bore 31 equipped in the laminated body 2 with lands 33 formed in each wiring layer. In the through hole 4 for prediction, similar to the through hole 3 for circuit, copper plating 42, which is a conductor formed on a wall of a through bore 41 equipped in the laminated body 2, is joined with lands 43 formed in each wiring layer. It is to be noted that the through hole 4 for prediction is not intended to electrically connect each wiring layer with each other, so that each land 43 is possible to be electrically independent of the circuit formed in each wiring layer. The through hole 4 for prediction is intended to predict a crack in the through hole 3 for circuit, and is designed to develop a crack prior to the through hole 3 for circuit. That is, the printed wiring board 1 according to the present embodiment is equipped with the through hole 4 for prediction separate from the through hole 3 for circuit but in the identical printed wiring board, thereby sensing a sign of cracks in the through hole 3 for circuit and enabling to take action before a crack comes to be developed in the through hole 3 for circuit. The through hole 3 for circuit and the through hole 4 for prediction are not limited to those using copper plating and may also be those using an electrically conductive material other than copper.

In the printed wiring board 1, a crack develops in the through hole 4 for prediction prior to the through hole 3 for circuit. Therefore, monitoring the presence of a crack developed in the through hole 4 for prediction enables to predict a crack to be developed in the through hole 3 for circuit. A crack to be developed in the through hole 3 for circuit becomes predictable, thereby enabling to take various precautionary measures, such as, for example, component replacement intended to avoid a trouble and prior backup intended to avoid data loss associated with a trouble. For example, in a case of electronics having a possibility that a sudden trouble triggers an accident, such as electronics for automobiles and medical equipment, it becomes possible to carry out warning to avoid an unexpected trouble and the like.

The through hole 4 for prediction becomes possible to trigger development of cracks prior to the through hole 3 for circuit by designing as follows, for example.

<First Example of Through Hole for Prediction>

Figure 2:
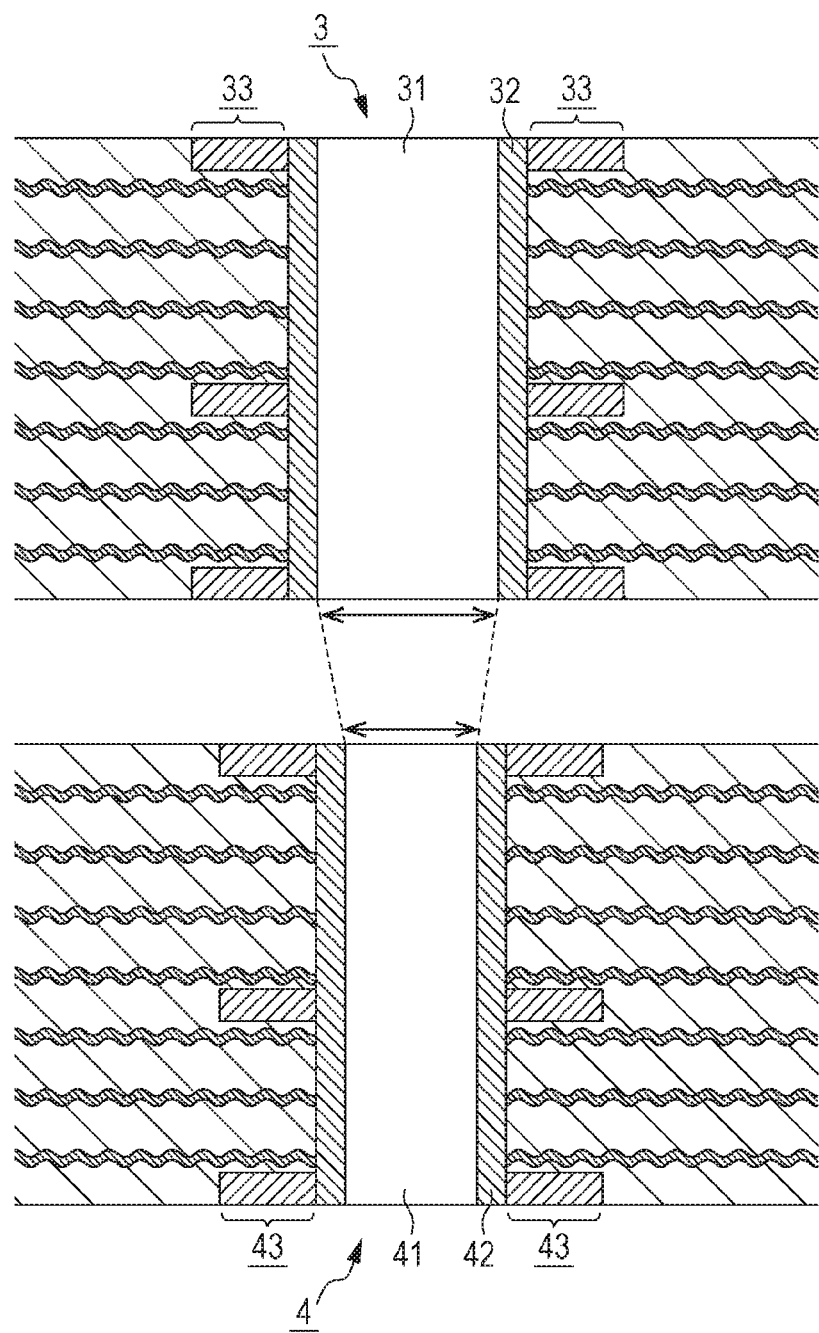
FIG. 2 is one example of a diagram of comparing dimensions of a through hole for circuit with dimensions of a through hole for prediction according to a first example.

FIG. 2 is one example of a diagram of comparing dimensions of the through hole 3 for circuit with dimensions of a through hole 4 for prediction according to a first example. The through hole 4 for prediction becomes possible to trigger development of cracks prior to the through hole 3 for circuit by, for example, being designed in such a manner that strength to expansion and contraction in a lamination direction of the laminated body 2 becomes lower than the strength of the through hole 3 for circuit compared with the through hole 3 for circuit.

For example, as the hole diameter of a through hole becomes smaller, the cross sectional area of copper plating of the through hole also becomes smaller with the square of the hole diameter. As the cross sectional area of the copper plating becomes smaller, the strength to the load acting along the lamination direction of the laminated body decreases. With that, the through hole 4 for prediction according to the first example is designed to have, for example, as illustrated in FIG. 2, a hole diameter of the through hole 4 for prediction smaller compared with the hole diameter of the through hole 3 for circuit. As the first example, compared with the through hole 3 for circuit, the through hole 4 for prediction has a smaller hole diameter than the hole diameter of the through hole 3 for circuit, thereby making it possible to trigger development of cracks prior to the through hole 3 for circuit.

<Second Example of Through Hole for Prediction>

Figure 3:
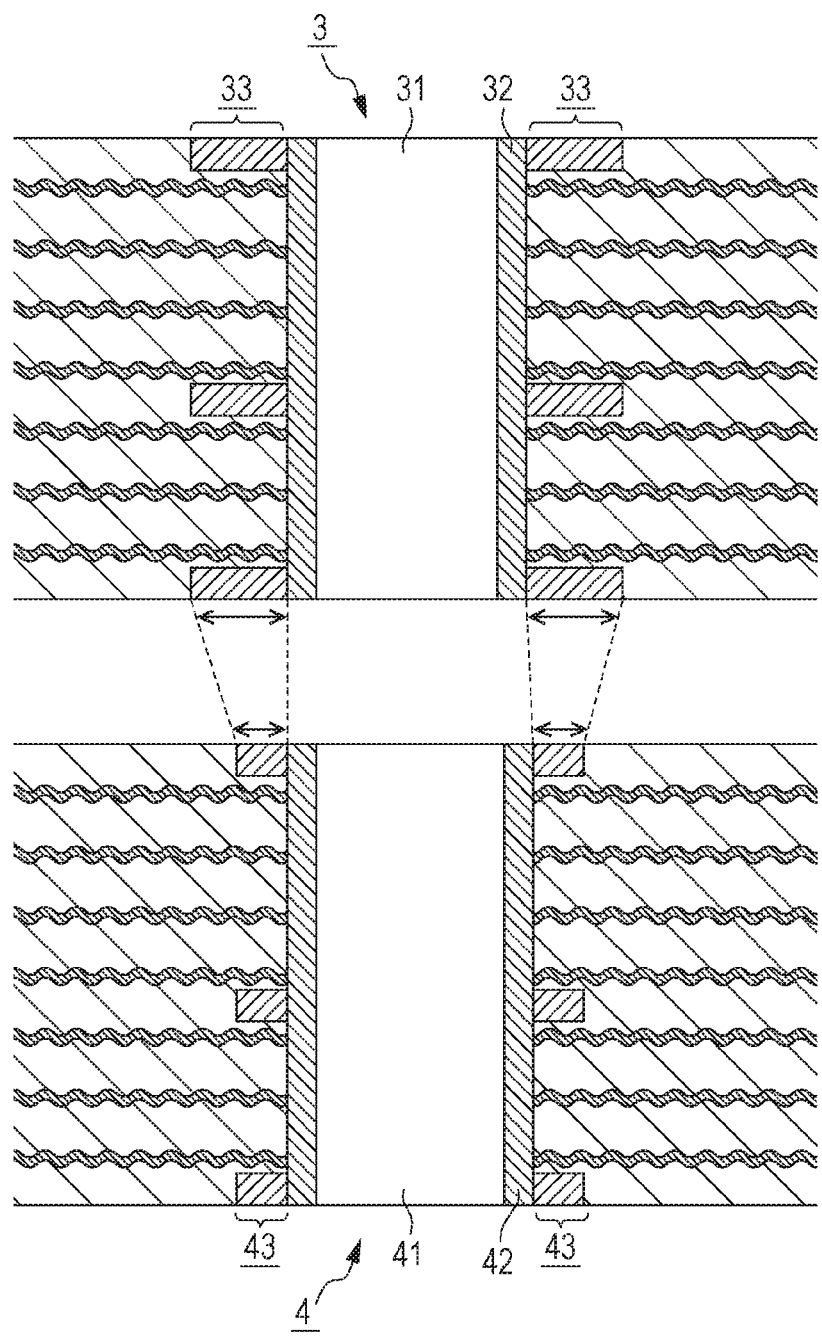
FIG. 3 is one example of a diagram of comparing dimensions of a through hole for circuit with dimensions of a through hole for prediction according to a second example.

FIG. 3 is one example of a diagram of comparing dimensions of the through hole 3 for circuit with dimensions of a through hole 4 for prediction according to a second example. The through hole 4 for prediction becomes possible to trigger development of cracks prior to the through hole 3 for circuit by, for example, being designed in such a manner that thermal stress applied from the lands 43 to copper plating 42 becomes higher than the thermal stress to the through hole 3 for circuit compared with the through hole 3 for circuit.

For example, since copper plating is joined with lands, when a force in a bending direction acts on the joint between the lands and the copper plating, a split and the like are prone to be developed in the copper plating. Particularly in the lands having a short length compared with lands having a long length, when the laminated body expands and contracts in the lamination direction, a force in the bending direction centered on the joint between the lands and the copper plating easily acts. With that, the through hole 4 for prediction according to the second example is designed to have, for example, as illustrated in FIG. 3, a length of lands 43 joined with the through hole 4 for prediction shorter than the length of lands 33 joined with the through hole 3 for circuit. As the second example, the through hole 4 for prediction has a shorter length of lands 43 joined with the through hole 4 for prediction than the length of lands 33 joined with the through hole 3 for circuit, thereby making it possible to trigger development of cracks prior to the through hole 3 for circuit.

<Third Example of Through Hole for Prediction>

Figure 4:
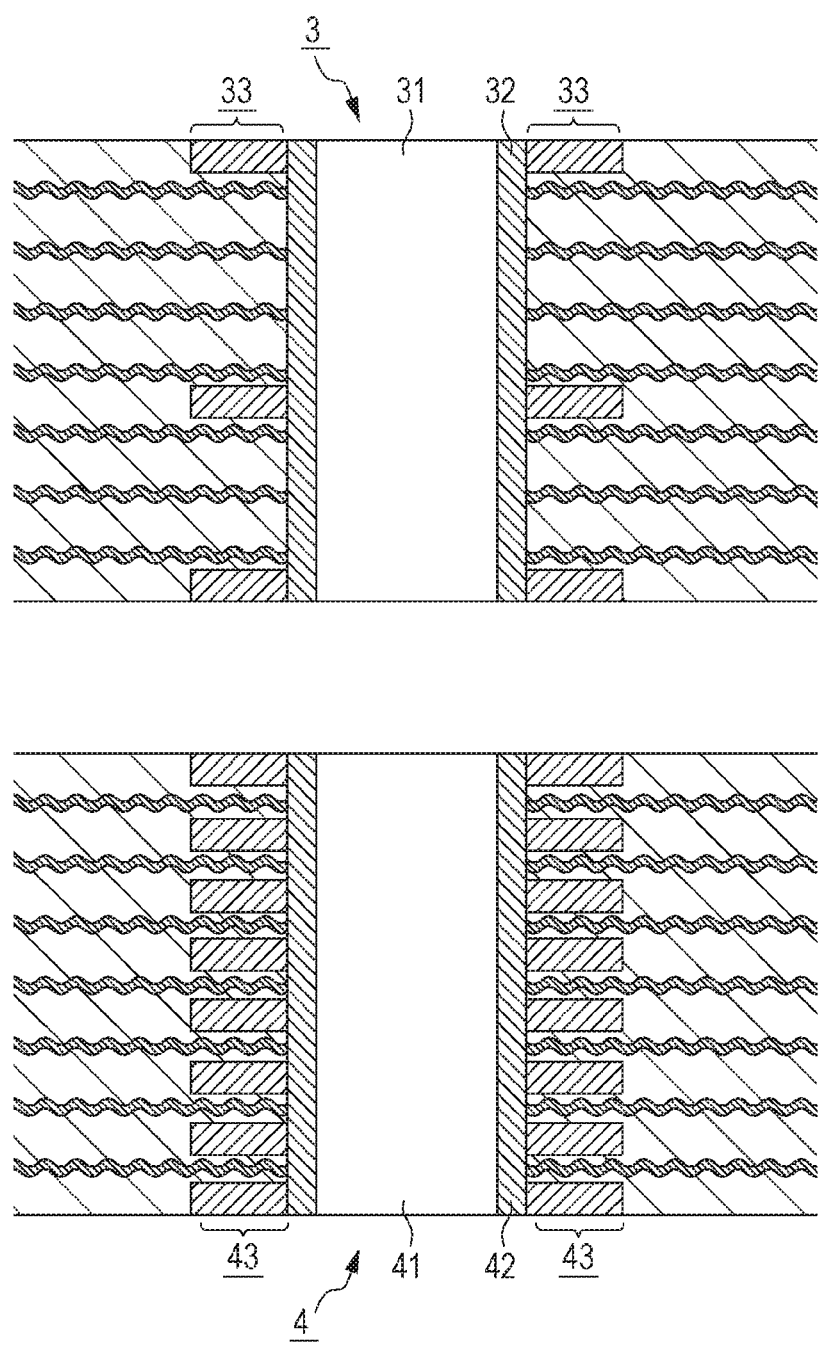
FIG. 4 is one example of a diagram of comparing a through hole for circuit with a through hole for prediction according to a third example.

FIG. 4 is one example of a diagram of comparing the through hole 3 for circuit with a through hole 4 for prediction according to a third example. The through hole 4 for prediction becomes possible to trigger development of cracks prior to the through hole 3 for circuit by, for example, being designed in such a manner that a number of lands 43 applying thermal stress to the copper plating 42 is more than the number of lands that the through hole 3 for circuit has compared with the through hole 3 for circuit.

For example, magnitude of the load that is applied from the lands to the copper plating varies depending on the number of joined lands. With that, the through hole 4 for prediction according to the third example is designed to have, for example, as illustrated in FIG. 4, a number of lands 43 joined with the through hole 4 for prediction more than the number of lands 33 joined with the through hole 3 for circuit. As the third example, the through hole 4 for prediction has a more number of lands 43 joined with the through hole 4 for prediction than the number of lands 33 joined with the through hole 3 for circuit, thereby making it possible to trigger development of cracks prior to the through hole 3 for circuit.

It is normally rare that the through hole 3 for circuit is electrically connected to circuits in all layers with wire and there is less possibility of joining the lands 33 all through the layers. Consequently, it is considered there are many cases that the number of lands 43 joining with the through hole 4 for prediction is possible to be more than the number of lands 33 joining with the through hole 3 for circuit.

<Fourth Example of Through Hole for Prediction>

Figure 5:
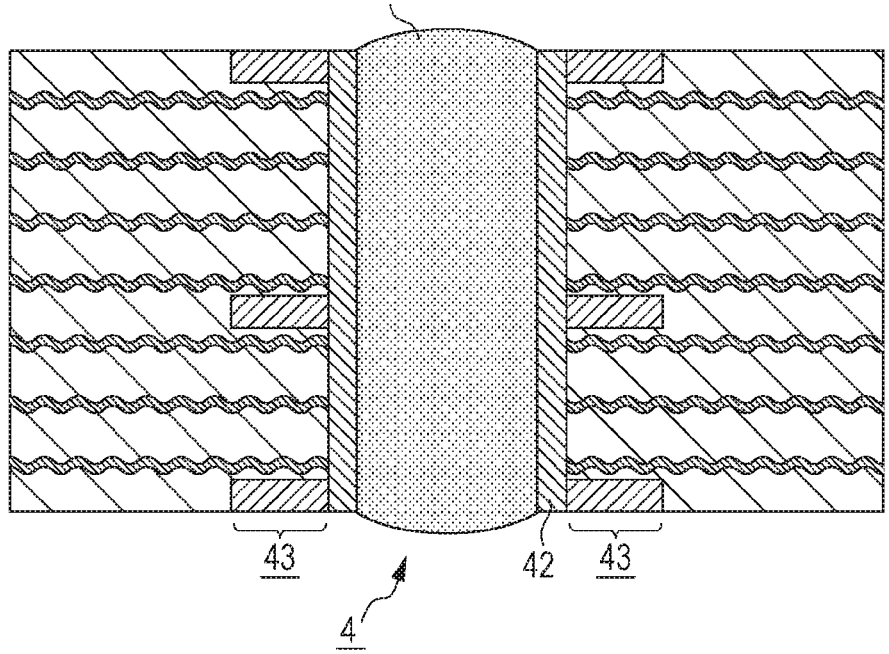
FIG. 5 is one example of a diagram illustrating a through hole for prediction according to a fourth example.

FIG. 5 is one example of a diagram illustrating a through hole 4 for prediction according to a fourth example. The through hole 4 for prediction becomes possible to trigger development of cracks prior to the through hole 3 for circuit by, for example, being designed in such a manner that the members applying thermal stress to the copper plating 42 is more than the members that the through hole 3 for circuit has compared with the through hole 3 for circuit.

For example, thermal stress that is applied to the copper plating varies depending on expansion and contraction of the member that makes contact with the copper plating. With that, in the through hole 4 for prediction according to the fourth example, for example, as illustrated in FIG. 5, a material having a higher coefficient of thermal expansion than the coefficient that the copper plating 42 has is injected into the through hole. As the material having a higher coefficient of thermal expansion than the coefficient that the copper plating 42 has is injected into the through hole, when the printed wiring board 1 repeats expansion and contraction due to the heat cycle, the thermal stress of the material injected into the through hole is further applied to the copper plating 42 of the through hole 4 for prediction. The material having a higher coefficient of thermal expansion than the coefficient that the copper plating 42 has may include, for example, a material similar to the resin that forms the laminated body 2 and the like. As the fourth example, in the through hole 4 for prediction, the material having a higher coefficient of thermal expansion than the coefficient that the copper plating 42 has is injected into the through hole, thereby making it possible to trigger development of cracks prior to the through hole 3 for circuit.

The material injected into the through hole 3 for circuit drags the copper plating 32 associated with expansion of the material and takes the role in further extending a crack developed in the copper plating 42. Consequently, although possible to be applied alone, the fourth example is more effective, for example, to be combined with any one or more examples of the first through third examples in view of taking the role in secondarily triggering development of cracks.

<Fifth Example of Through Hole for Prediction>

Figure 6:
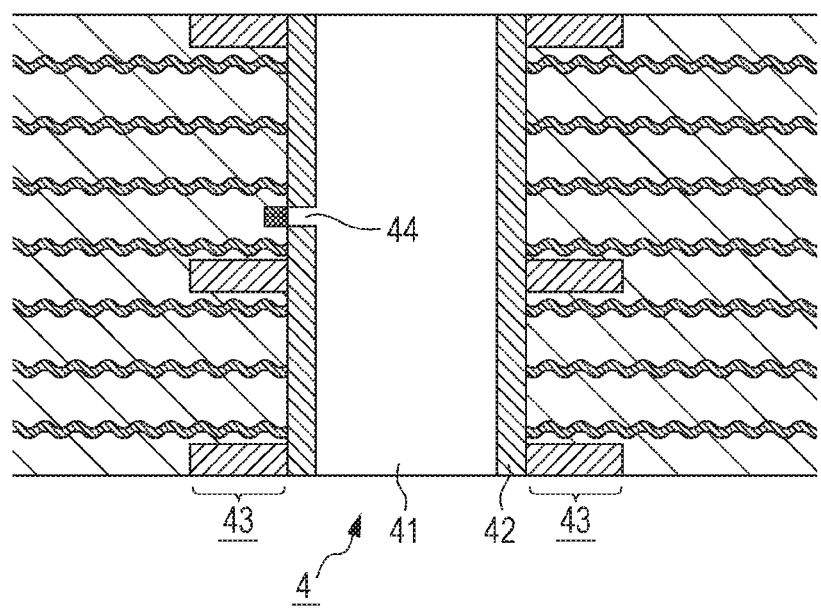
FIG. 6 is one example of a diagram illustrating a through hole for prediction according to a fifth example.

FIG. 6 is one example of a diagram illustrating a through hole 4 for prediction according to a fifth example. The through hole 4 for prediction becomes possible to trigger development of cracks prior to the through hole 3 for circuit by, for example, equipping a pinhole 44 in the copper plating 42 in advance. When the pinhole 44 is formed in the copper plating 42 in advance, the pinhole 44 becomes a start of crack development. Therefore, when the printed wiring board 1 repeats expansion and contraction due to the heat cycle, the copper plating 42 is prone to break around the pinhole 44. As the fifth example, in the through hole 4 for prediction, the pinhole 44 is formed, thereby making it possible to trigger development of cracks prior to the through hole 3 for circuit.

<Sixth Example of Through Hole for Prediction>

FIG. 7 is one example of a diagram of comparing the lands 33 around the through hole 3 for circuit with lands 43 around a through hole 4 for prediction according to a sixth example. The through hole 4 for prediction becomes possible to trigger development of cracks prior to the through hole 3 for circuit by, for example, being designed in such a manner that thermal stress applied from the laminated body 2 to copper plating 42 becomes higher than the thermal stress to the through hole 3 for circuit compared with the through hole 3 for circuit.

For example, an amount of expansion and contraction in a lamination direction of the laminated body 2 is proportional to the coefficient of thermal expansion of the laminated body 2 in the lamination direction. For example, an electrically conductive material, such as copper, forming the lands has a smaller coefficient of thermal expansion compared with the resin forming the laminated body 2. With that, for example, as illustrated in FIG. 7, the lands 43 disposed around the through hole 4 for prediction is made less than the lands 33 disposed around the through hole 3 for circuit. In such a manner, the coefficient of thermal expansion of the laminated body 2 around the through hole 4 for prediction in a lamination direction becomes larger than the coefficient of thermal expansion in a lamination direction around the through hole 3 for circuit. As a result, when the printed wiring board 1 is thermally expanded, the laminated body 2 around the through hole 4 for prediction expands larger than the laminated body 2 around the through hole 3 for circuit. The laminated body 2 around the through hole 4 for prediction expands larger than the laminated body 2 around the through hole 3 for circuit, thereby making the through hole 4 for prediction possible to trigger development of cracks prior to the through hole 3 for circuit.

<Seventh Example of Through Hole for Prediction>

Figure 8:
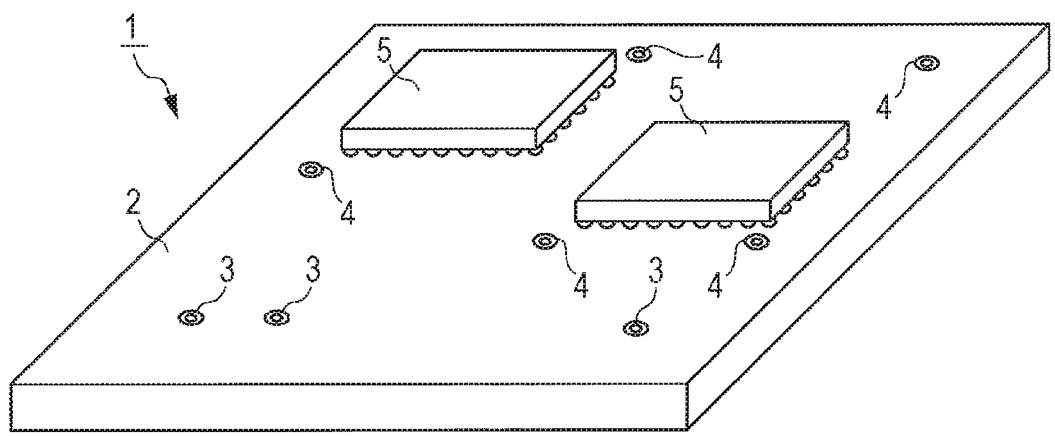
FIG. 8 is one example of a perspective view of a printed wiring board having a through hole for circuit and a through hole for prediction according to a seventh example disposed therein.

FIG. 8 is one example of a perspective view of the printed wiring board 1 having the through holes 3 for circuit and the through holes 4 for prediction according to the seventh example disposed therein. The through holes 4 for prediction are disposed in areas where, for example, the amount of expansion and contraction in a lamination direction of the laminated body 2 is larger than areas where the through holes 3 for circuit are disposed within the printed wiring board 1, thereby making it possible to trigger development of cracks prior to the through hole 3 for circuit.

For example, a great amount of thermal stress is prone to develop around an electronic component with relatively large heat generation, such as a large scale integration (LSI)

operating at high speed, like a central processing unit (CPU) and a graphics processing unit (GPU), and an electronic component with high power consumption. In particular, an electronic component that is repeatedly turned on and off turns out to not only generate heat at high temperatures but also to give thermal shock due to the change in temperature. With that, the through holes 4 for prediction according to the seventh example are disposed, for example, as illustrated in FIG. 8, at positions relatively close to semiconductor devices 5 with great heat generation compared with the through holes 3 for circuit. The configuration of through holes 4 for prediction according to the seventh example may be same as the through holes 3 for circuit or may also be same as any one of the first through sixth examples. The through holes 4 for prediction are disposed at positions closer to the semiconductor devices 5 than the through holes 3 for circuit, thereby making it possible to trigger development of cracks prior to the through hole 3 for circuit.

<Eighth Example of Through Hole for Prediction>

Figure 9:
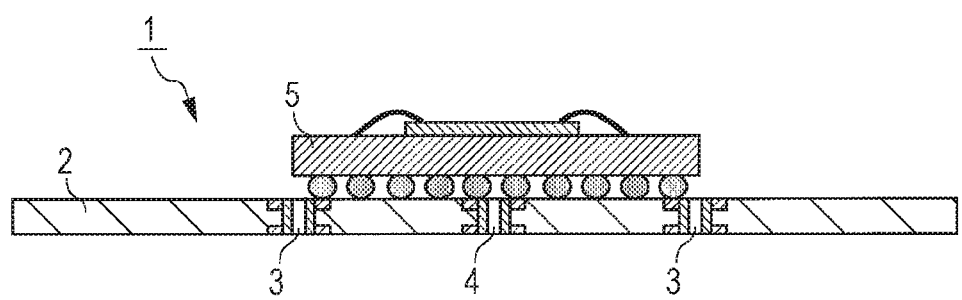
FIG. 9 is one example of a structural diagram of a printed wiring board having a through hole for circuit and a through hole for prediction according to an eighth example disposed therein.

FIG. 9 is one example of a structural diagram of the printed wiring board 1 having the through holes 3 for circuit and a through hole 4 for prediction according to an eighth example disposed therein. The through hole 4 for prediction is disposed, for example, as illustrated in FIG. 9, near a central portion of the semiconductor device 5 in which a great amount of thermal stress is particularly prone to develop within the semiconductor device 5 of high heat generation. In the meanwhile, the through holes 3 for circuit are disposed, for example, as illustrated in FIG. 9, near the edge of the semiconductor device 5 with thermal stress smaller than the thermal stress near the central portion within the semiconductor device 5 of high heat generation. The through hole 4 for prediction according to the eighth example may have a configuration same as the through holes 3 for circuit or may also have a configuration same as any of the first through sixth examples. Even when being of an identical electronic component, the through hole 4 for prediction is disposed in a portion with thermal stress relatively smaller than the through holes 3 for circuit, thereby making it possible to trigger development of cracks prior to the through hole 3 for circuit.

The through hole 4 for prediction according to any one example of the first through eighth examples may also be combined, for example, with a configuration provided in a through hole 4 for prediction according to any other example.

The through hole 4 for prediction is not limited to any one example of the first through eighth examples or a combination of any one or more examples with each other. The through hole 4 for prediction may also be made with, for example, the copper plating 42 having a thickness thinner than the copper plating 32 of the through hole 3 for circuit, thereby making it possible to trigger development of cracks prior to the through hole 3 for circuit.

In addition, the printed wiring board 1 is not limited to those having a large number of wiring layers and may also be, for example, one having two wiring layers or having three or more wiring layers.

<One Example of Development State of Cracks in Through Hole for Prediction>

Figure 10:
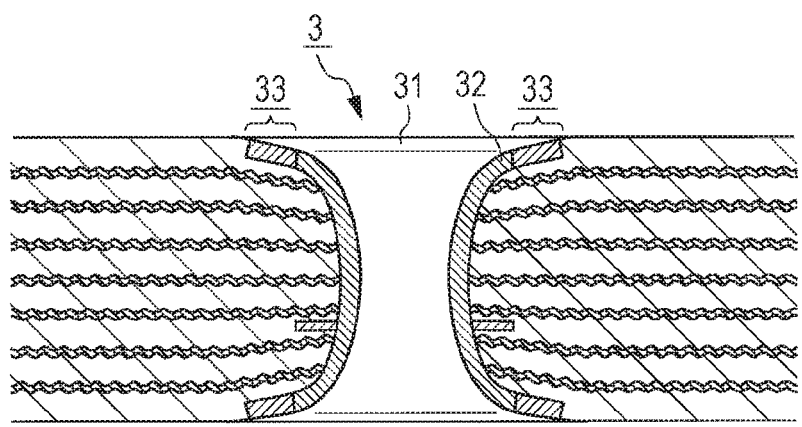
FIG. 10 is one example of a state diagram of a through hole for circuit when a printed wiring board expands along a lamination direction of a laminated body.

FIG. 10 is one example of a state diagram of the through hole 3 for circuit when the printed wiring board 1 expands along a lamination direction of the laminated body 2. The copper plating 32 has a smaller coefficient of thermal expansion compared with the coefficient of thermal expansion of a material, such as a resin forming the laminated body 2. Consequently, when the temperature of the printed wiring board 1 rises to expand the laminated body 2 along the lamination direction, the copper plating 32 is pulled along the lamination direction.

Figure 11:
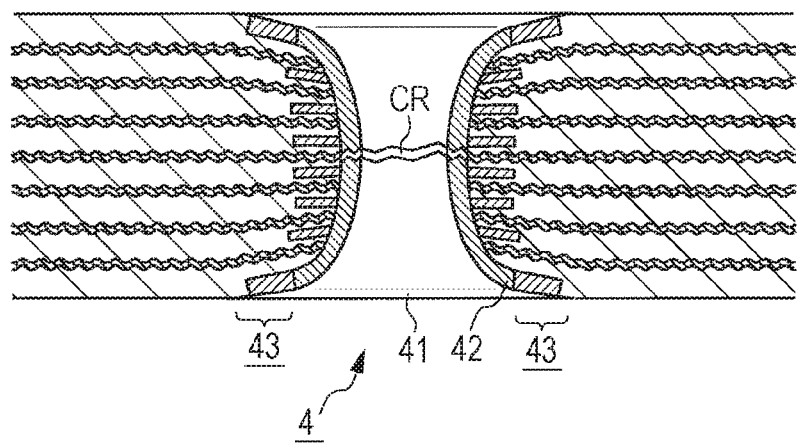
FIG. 11 is one example of a state diagram of a through hole for prediction when a printed wiring board expands along a lamination direction of a laminated body.

FIG. 11 is one example of a state diagram of the through hole 4 for prediction when the printed wiring board 1 expands along the lamination direction of the laminated body 2. The through hole 4 for prediction is designed in such a manner that a crack develops prior to the through hole 3 for circuit. Therefore, when the printed wiring board 1 repeats expansion and contraction due to the heat cycle, a crack CR develops in the copper plating 42 of the through hole 4 for prediction prior to the copper plating 32 of the through hole 3 for circuit.

In FIGS. 10 and 11, state diagrams illustrating through holes that are equivalent to the through hole 3 for circuit and the through holes 4 for prediction according to the third example illustrated in FIG. 4. However, the state of the through hole when the laminated body 2 expands along the lamination direction is basically similar in any of the first through eighth examples.

<First Example of Method of Manufacturing Printed Wiring Board>

Figure 12:
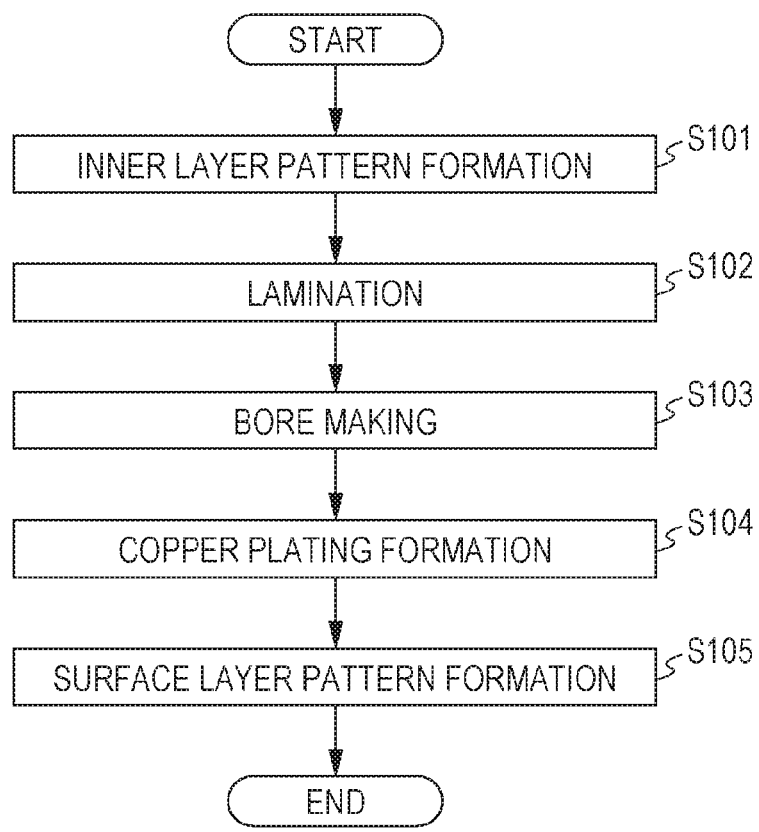
FIG. 12 is one example of a diagram illustrating a flowchart of a manufacturing procedure according to a first example.

It is possible to manufacture the printed wiring board 1 in, for example, the following process. FIG. 12 is one example of a diagram illustrating a flowchart of a manufacturing procedure according to a first example. Each diagram of FIGS. 13A through 13E is one example illustrating each state in the manufacturing procedure according to the first example. In the description of the following manufacturing process, although descriptions are given mainly to in a process of forming the through hole 4 for prediction, the through hole 3 for circuit is also formed in the following manufacturing process simultaneously.

Figure 13C:
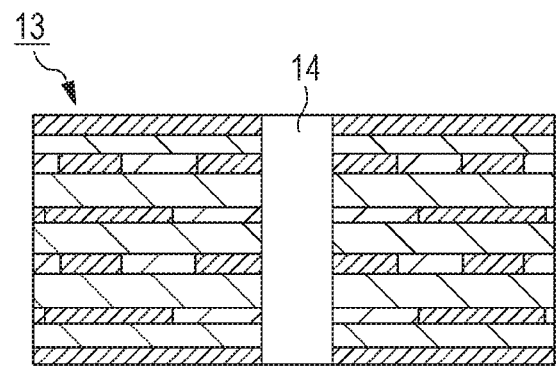
Figure 13D:
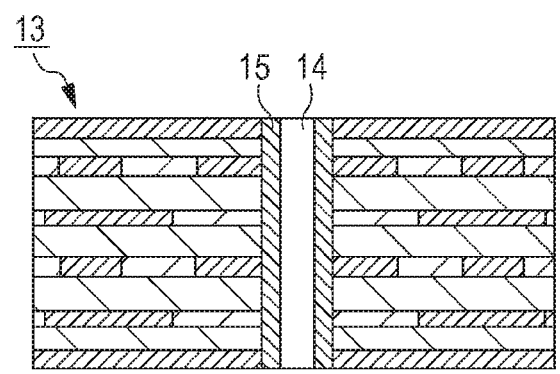
Figure 13E:
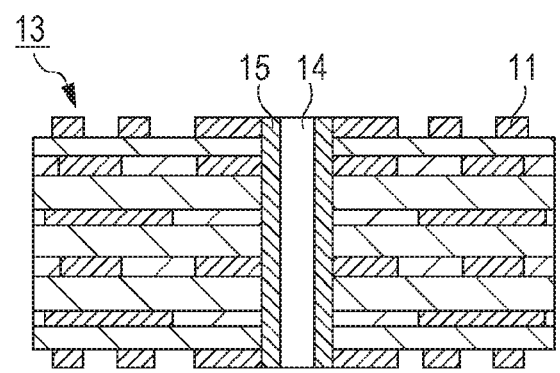

In order to manufacture the printed wiring board 1, for example, a wiring pattern 11 of an inner layer portion of the printed wiring board 1 is formed in a substrate 12 (S101, FIG. 13A). Next, the substrates 12 having the wiring pattern 11 formed therein are stacked on each other for lamination (S102, FIG. 13B). Next, a through bore 14 is formed in a laminated body 13 having the substrates 12 stacked therein (S103, FIG. 13C). Next, a surface of the laminated body 2 is subjected to a resist and is immersed in a treatment liquid to form copper plating 15 on an inner wall of the through bore 14 (S104, FIG. 13D). Next, the wiring pattern 11 of an outer layer portion of the printed wiring board 1 is formed on a surface of the laminated body 13 (S105, in FIG. 13E).

The manufacturing process may also include a process other than the processes from step S101 to step S105. The manufacturing process of the above one example is executed, thereby making it possible to fabricate the printed wiring board 1 provided with the through hole 4 for prediction according to the first through eighth examples except the fifth example.

<Second Example of Method of Manufacturing Printed Wiring Board>

Figure 14:
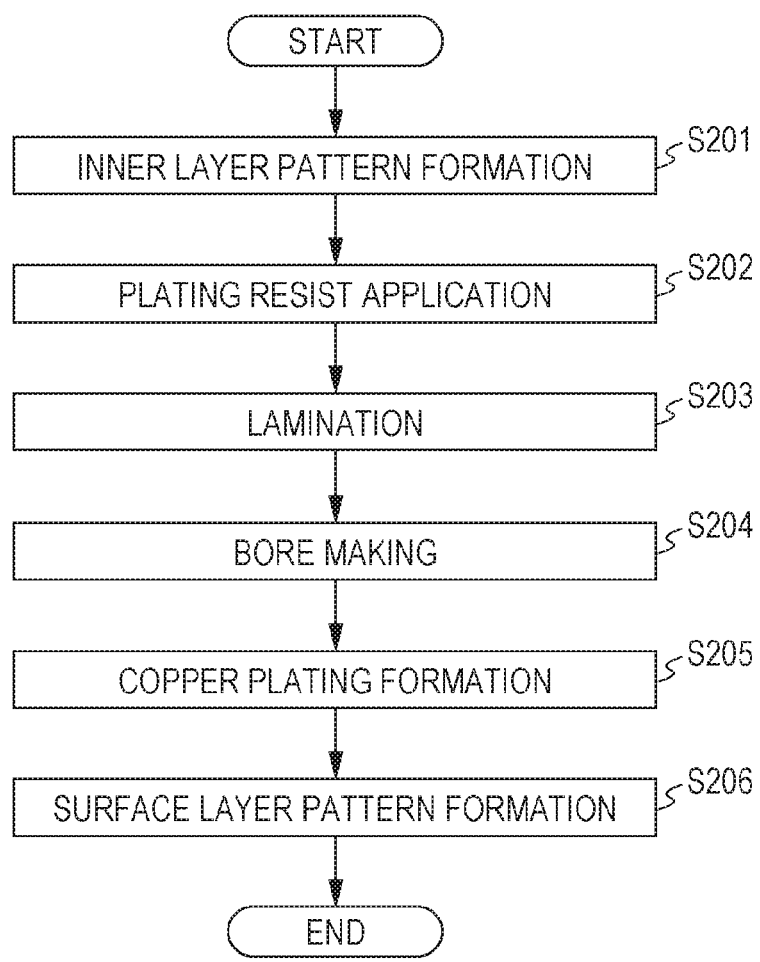
FIG. 14 is one example of a diagram illustrating a flowchart of a manufacturing procedure according to a second example.

In a case of forming the through hole 4 for prediction according to the fifth example illustrated in FIG. 6, it is possible to manufacture the printed wiring board 1 in the following process, for example. FIG. 14 is one example of a diagram illustrating a flowchart of a manufacturing procedure according to a second example. Each diagram of FIGS. 15A through 15F is one example illustrating a state of each manufacturing procedure. In the description of the following manufacturing process, although descriptions are given mainly to in a process of forming the through hole 4 for prediction, the through hole 3 for circuit is also formed in the following manufacturing process simultaneously.

Figure 15A:
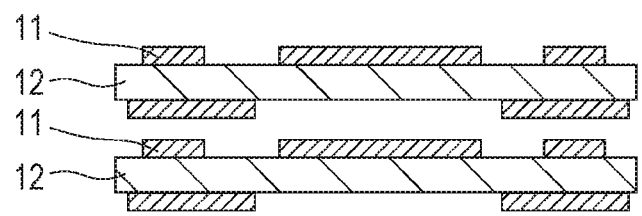
FIGS. 15A through 15F are examples of drawings illustrating first through sixth states of the manufacturing procedure according to the second example.
Figure 15B:
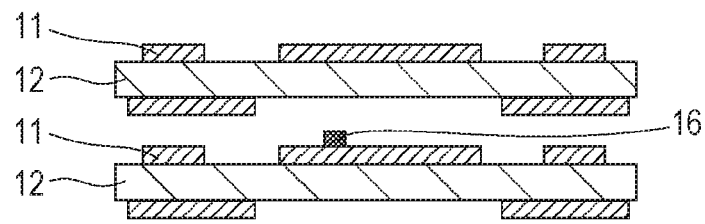
Figure 15C:
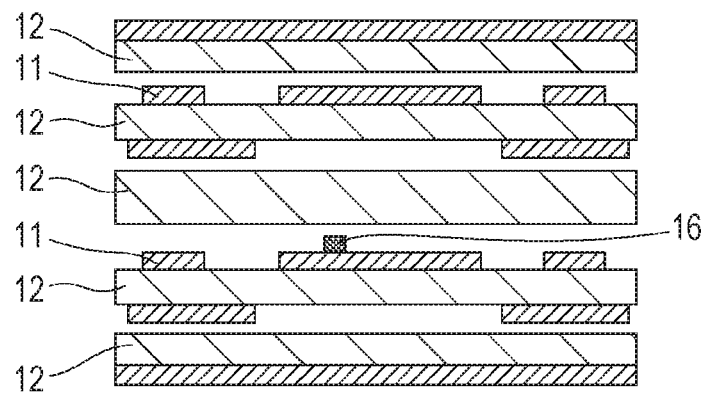
Figure 15D:
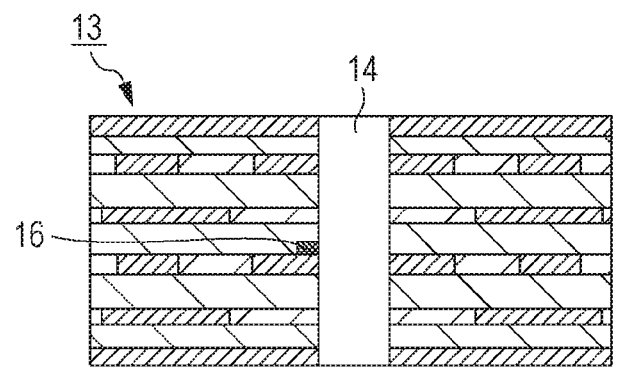
Figure 15E:
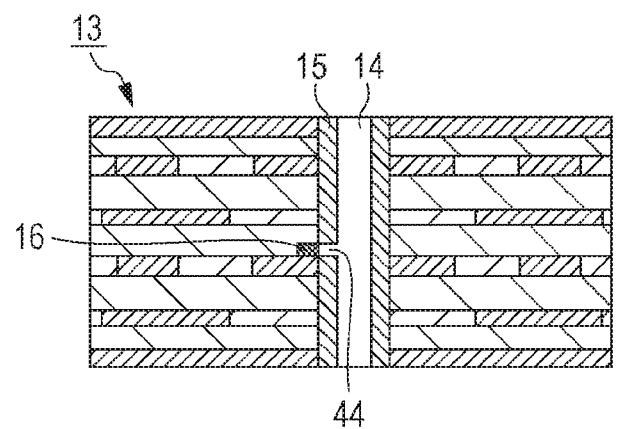
Figure 15F:
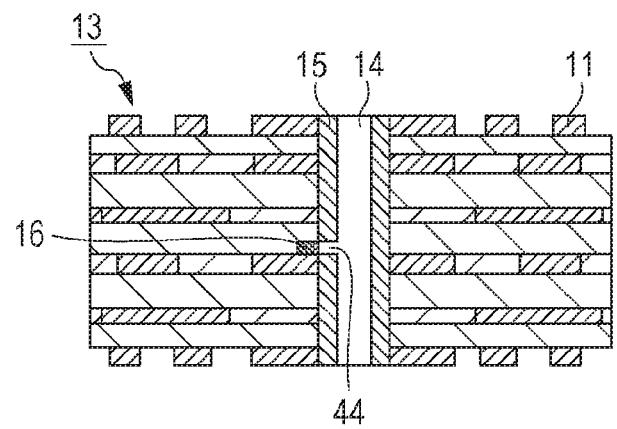

In order to manufacture the printed wiring board 1 equipped with the through hole 4 for prediction according to the fifth example, similar to the above manufacturing method according to the first example, for example, the wiring pattern 11 of an inner layer portion of the printed wiring board 1 is formed in a substrate 12 (S201, FIG. 15A). Next, a plating resist 16 is applied on a portion to form the through hole 4 for prediction (S202, FIG. 15B). The procedures after that are basically similar to the manufacturing method according to the above first example. That is, the substrates 12 having the wiring pattern 11 formed therein are stacked on each other for lamination (S203, FIG. 15C), and after that, a through bore 14 is formed (S204, FIG. 15D). Next, copper plating 15 is formed on an inner wall of the through bore 14 (S205, FIG. 15E). At this time, the portion of exposing the plating resist 16 within the inner wall of the through bore 14 is still in a state of not having the copper plating 32 formed therein, and the pinhole 44 is formed in the copper plating 32. Next, the wiring pattern 11 of an outer layer portion of the printed wiring board 1 is formed on a surface of the laminated body 13 (S206, in FIG. 15F). The manufacturing process may also include a process other than the processes from step S201 to step S206.

<Embodiment of Crack Prediction Device>

Figure 16:
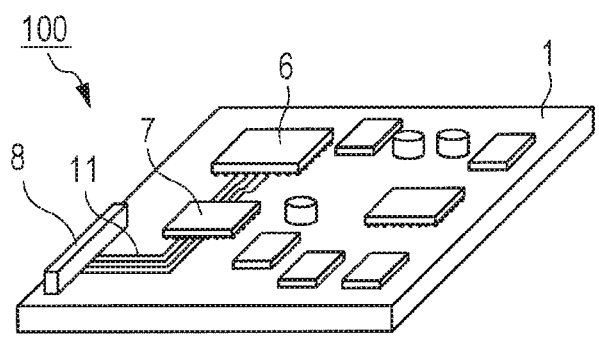
FIG. 16 is one example of a diagram illustrating an electronic component that is possible to predict a crack in a through hole equipped in a printed wiring board.

FIG. 16 is one example of a diagram illustrating an electronic component possible to predict a crack in a through hole equipped in a printed wiring board. An electronic component 100 is an electronic component applicable to various electronics and has various components, such as an IC chip and a capacitor, mounted on the printed wiring board 1 described above. The electronic component 100 is provided with a detection circuit 7 to monitor resistance of a through hole for prediction equipped in an area where a CPU 6 to be at relatively high temperatures is disposed within the printed wiring board 1. The detection circuit 7 is linked through the wiring pattern 11 to a connector 8 and the through hole for prediction. The electronic component 100 is provided with the through hole for prediction and the detection circuit 7, so that it may be understood as a crack prediction device.

Figure 17:
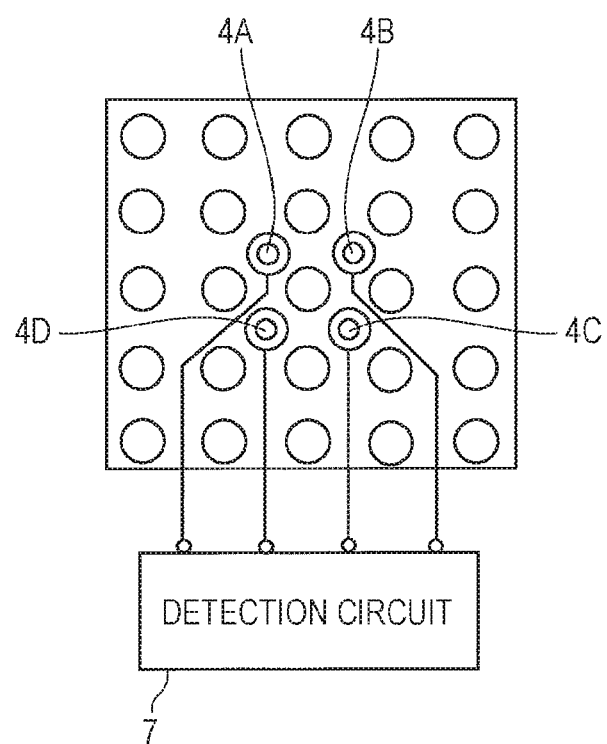
FIG. 17 is one example of a diagram illustrating a lower side portion of a CPU of a printed wiring board.

FIG. 17 is one example of a diagram illustrating a lower side portion of the CPU 6 of the printed wiring board 1. The electronic component 100 according to the present embodiment is, for example, equipped with four through holes 4A through 4D for prediction linked to the detection circuit 7 in the lower side portion of the CPU 6. The through holes 3 for circuit are disposed appropriately in other areas.

Figure 18:
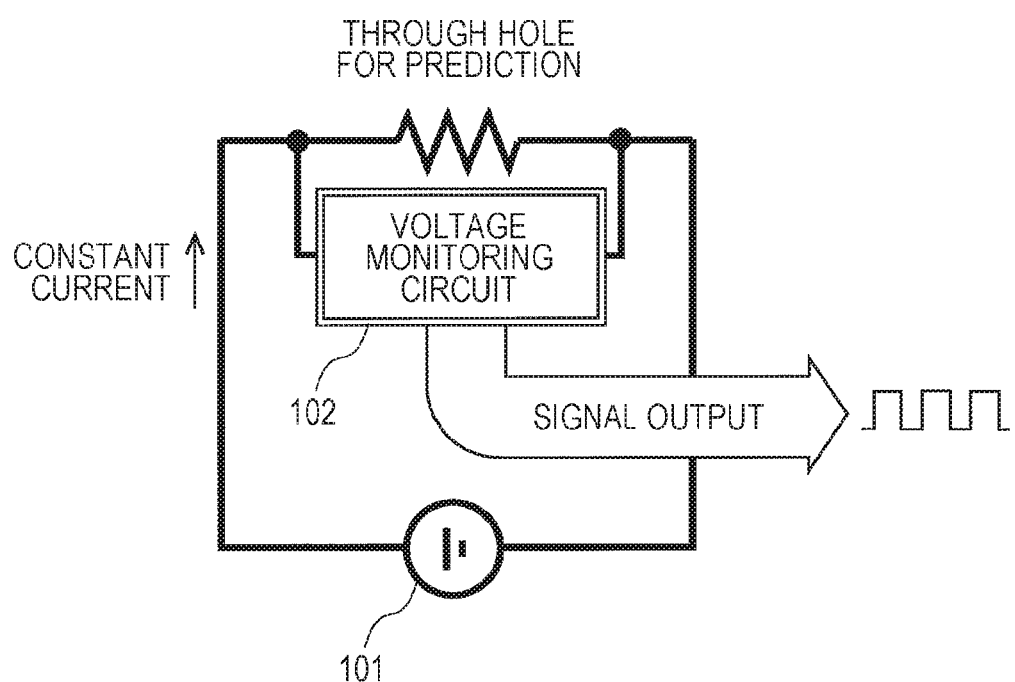
FIG. 18 is one example of a diagram illustrating an image of a circuit achieved by a detection circuit.

FIG. 18 is one example of a diagram illustrating an image of a circuit achieved by the detection circuit 7. The through hole 4 for prediction is connected to a direct current power supply 101 to automatically adjust a voltage so as to flow a constant current and a voltage monitoring circuit 102 to measure a voltage at both ends of the through hole 4 for prediction. The voltage monitoring circuit 102 carries out measurement of a voltage, thereby monitoring a change in electrical resistance of the through hole 4 for prediction. Although FIG. 18 illustrates one through hole 4 for prediction, similar circuits are achieved respectively for the other three through holes 4 for prediction.

Figure 19:
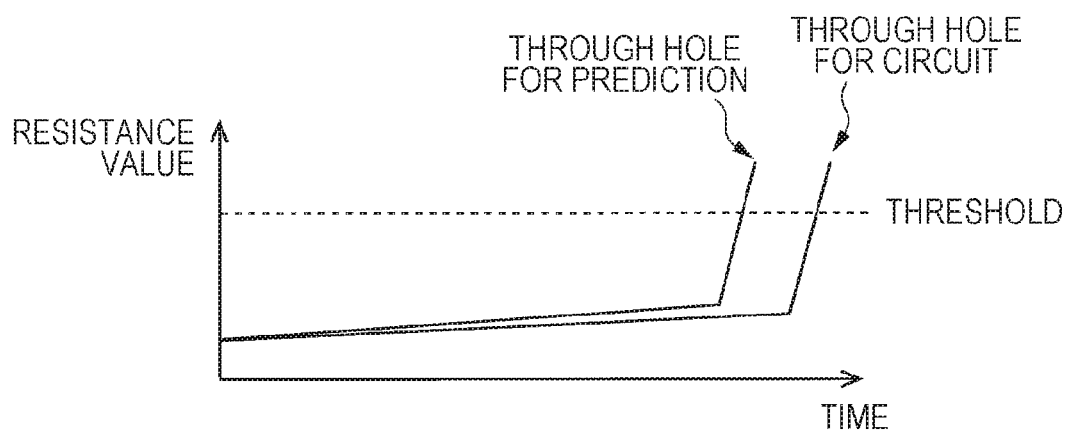
FIG. 19 is one example of a graph illustrating relationship between a lapse time since use of an electronic component is started and resistance values of a through hole for prediction and a through hole for circuit.

FIG. 19 is one example of a graph illustrating relationship between a lapse time since use of the electronic component 100 is started and the resistance values of the through hole 4 for prediction and the through hole 3 for circuit. As the use of the electronic component 100 is started, the heat cycle is added to the through hole 4 for prediction and the through hole 3 for circuit and a resistance value gradually increases due to development of a minute crack and the like. Then, a crack develops in the through hole 4 for prediction prior to the through hole 3 for circuit and the resistance value exceeds a predetermined threshold. As sensing that the resistance value of the through hole 3 for circuit exceeds the predetermined threshold, the voltage monitoring circuit 102 transmits a signal to outside of the electronic component 100 through the connector 8. The threshold may be defined based on, for example, a resistance change rate to an initial resistance value when the electronic component 100 is shipped and may also be defined uniformly for each product. The signal transmitted to outside of the electronic component 100 is sent to, for example, a monitor, a speaker, and indicators linked to the electronic component 100 or sent to devices executing a predetermined operation when the signal is sensed.

As long as a crack prediction device is achieved by the above electronic component 100, it is enabled to take various precautionary measures using a signal outputted to outside. For example, in a case of being applied to an on-board electronics in car, displaying information on a monitor, a front panel, or the like of a car navigation device or playing a message sound from a speaker or the like enables to tell a message to encourage a user to repair or replacement of a component. In addition, in a case of a large scale information processing system, it is enabled to execute various processes in advance that have to be executed before the system comes to stop.

Figure 20:
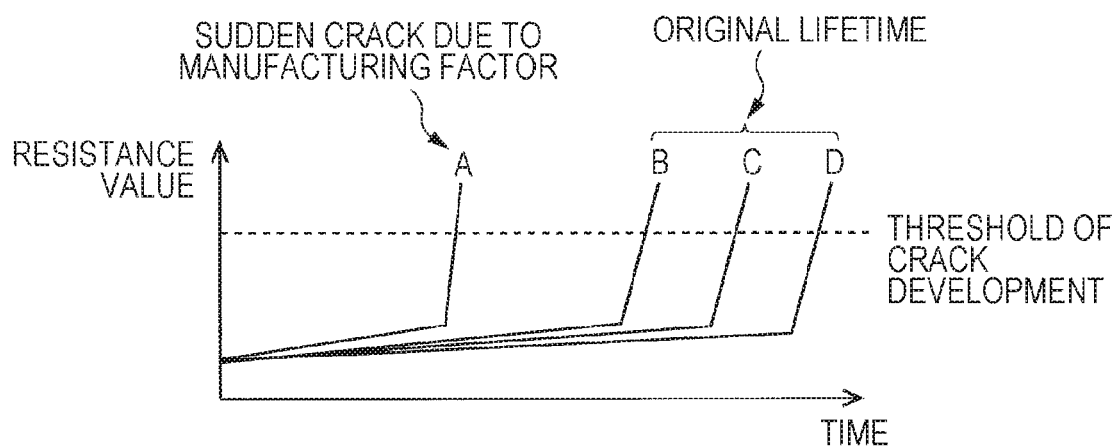
FIG. 20 is one example of a graph illustrating relationship between a lapse time since use of an electronic component is started and resistance values of four through hole for prediction.

FIG. 20 is one example of a graph illustrating relationship between a lapse time since use of the electronic component 100 is started and resistance values of the four through holes 4A through 4D for prediction. The through holes 4 for prediction may have defects in a manufacturing process and the like in some cases. For example, as illustrated in FIG. 20, it is assumed that one through hole for prediction (for example, in a case of FIG. 20, the through hole 4A for prediction) among the four through holes 4A through 4D for prediction has a problem in manufacture, which causes a sudden crack to be developed. In such a case, when a signal is immediately transmitted from the voltage monitoring circuit 102, it turns out to make the user to take useless action although the electronic component 100 is actually possible to be sufficiently used. With that, the voltage monitoring circuit 102 may transmit a signal in a case that, for example, the electrical resistances of any two, three, or four or more through holes 4 for prediction among the four through holes 4A through 4D for prediction exceed a threshold. Crack development in the through hole 3 for circuit is monitored in AND condition by the plurality of through holes 4 for prediction, thereby enabling to avoid wrong advance notice of crack development in the through hole 3 for circuit.

The electronic component 100 is not limited to those equipped with the four through holes 4A through 4D for prediction, and for example, may be those equipped with one through three through holes 4 for prediction and may also be those equipped with five or more through holes 4 for prediction.

Each through hole 4 for prediction is not limited to those all being placed in the portion of the CPU 6 of high heat generation. The electronic component 100 may also have, for example, the through holes 4 for prediction disposed in relatively low temperature areas other than the spots where the CPU 6 of high heat generation is placed within the printed wiring board 1 to avoid wrong advance notice of crack development in the through hole 3 for circuit.

The crack prediction device is not limited to those carrying out advance notice based on whether or not a resistance value of the through hole 4 for prediction exceeds a predetermined threshold, and for example, may also carry out advance notice after the resistance of the through hole 4 for prediction becomes fully open.

The crack prediction device is not limited to those achieved by the electronic component 100 having various components mounted thereon. The crack prediction device may also have, for example, the detection circuit 7 mounted on a printed wiring board prepared separately from the electronic component 100 equipped with the through hole for prediction.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A printed wiring board comprising:
   a laminated body that has a plurality of wiring layers laminated therein;
   a first through hole formed in the laminated body and electrically connects two or more wiring layers with each other;
   a second through hole formed in the laminated body and has strength to expansion and contraction of the laminated body less than in the first through hole; and
   a detection circuit formed on the laminated body that monitors a change in electrical resistance of the second through hole,
   wherein the first through hole and the second through hole comprises a copper plating that is disposed along an interior wall of the first through hole and the second through hole, and
   wherein a material formed only on an inner wall filled in the second through hole and having a coefficient of thermal expansion greater than an electrically conductive material,
   wherein the second through hole has, compared with the first through hole, a lamer number of lands adjacent to the second through hole.

* * * * *